United States Patent [19]

Badet et al.

[11] 4,371,744
[45] Feb. 1, 1983

[54] SUBSTRATE FOR INTERCONNECTING ELECTRONIC INTEGRATED CIRCUIT COMPONENTS HAVING A REPAIR ARRANGEMENT ENABLING MODIFICATION OF CONNECTIONS TO A MOUNTED CHIP DEVICE

[75] Inventors: Bernard Badet, Belfort; Karel Kurzweil, Eaubonne, both of France

[73] Assignee: Compagnie Internationale pour l'Informatique CII-Honeywell Bull (Societe Anonyme), Paris, France

[21] Appl. No.: 296,835

[22] Filed: Aug. 27, 1981

Related U.S. Application Data

[63] Continuation of Ser. No. 948,110, Oct. 3, 1978, abandoned.

[30] Foreign Application Priority Data

Oct. 3, 1977 [FR] France .............................. 77 29687

[51] Int. Cl.³ .............................................. H05K 1/18
[52] U.S. Cl. .................................. 174/68.5; 361/409; 361/410; 361/414
[58] Field of Search .............. 174/68.5; 361/409, 410, 361/414; 29/827, 847

[56] References Cited

U.S. PATENT DOCUMENTS

| | | | |
|---|---|---|---|
| 3,541,223 | 11/1970 | Helms | 361/414 X |
| 3,691,290 | 9/1972 | Napier | 361/406 X |
| 3,726,002 | 4/1973 | Greenstein et al. | 174/68.5 X |
| 3,777,220 | 12/1973 | Tatusko et al. | 174/68.5 X |
| 3,803,483 | 4/1974 | McMahon | 361/409 X |
| 3,898,370 | 8/1975 | Davy et al. | 174/68.5 |
| 3,923,359 | 12/1975 | Newsam | 361/414 X |

Primary Examiner—R. R. Kucia
Attorney, Agent, or Firm—Kerkam, Stowell, Kondracki & Clarke

[57] ABSTRACT

An interconnecting substrate according to the invention comprises an insulating base on which rests a set of alternating, superimposed conductive and insulating layers. Contacts are formed on the uppermost insulating layer which border at least one site or zone intended for an integrated circuit chip device whose output conductors are to be connected to the said contacts. Through-connections enable the contacts to be coupled to one of the inner conductive layers. The through-connections include at least one through-connection on the inside of the site relative to at least a predetermined one of the said contacts. A shunt conductor means connected to the predetermined contact has a part outside the site which is connected to an additional contact which serves as a substitute or replaces the said predetermined contact for the connection to the associated output conductor of the chip device. The repair arrangement according to the invention allows one to substitute for a connection inside a site over which a chip is situated between a contact and a through-connection, a link which has a part outside the site from which it is possible to make a repair or modification of the circuit function without the need to remove the component. The repair arrangement is made up of conductive and insulating layers which are deposited at least locally on the substrate.

5 Claims, 14 Drawing Figures

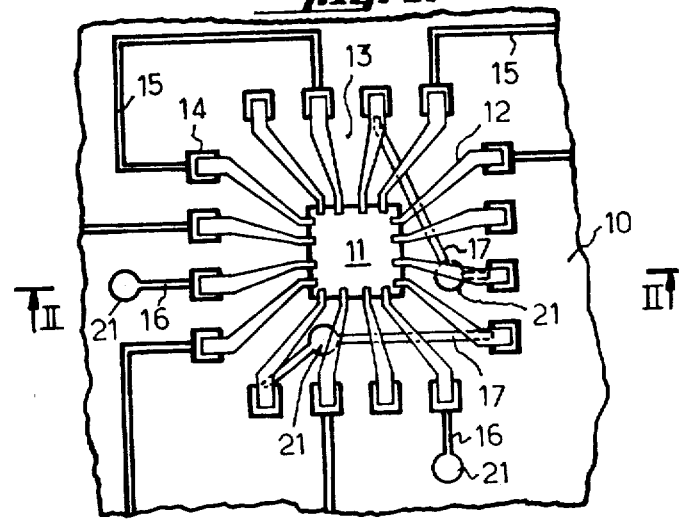
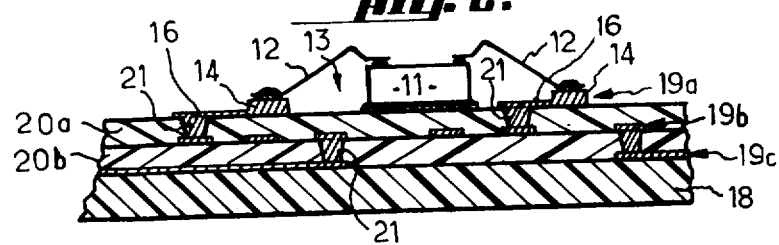
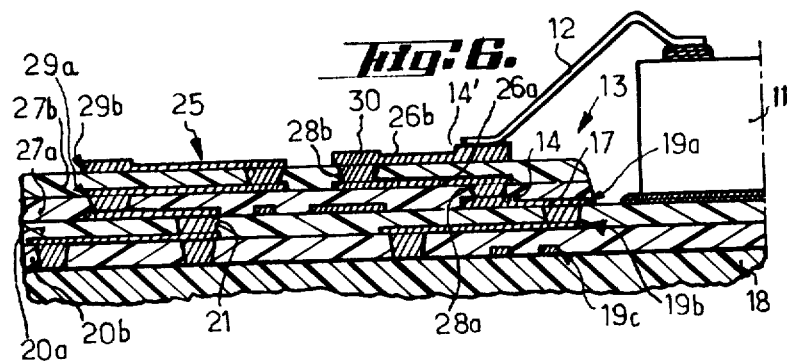
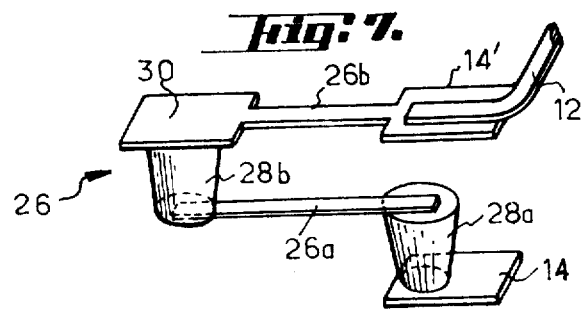

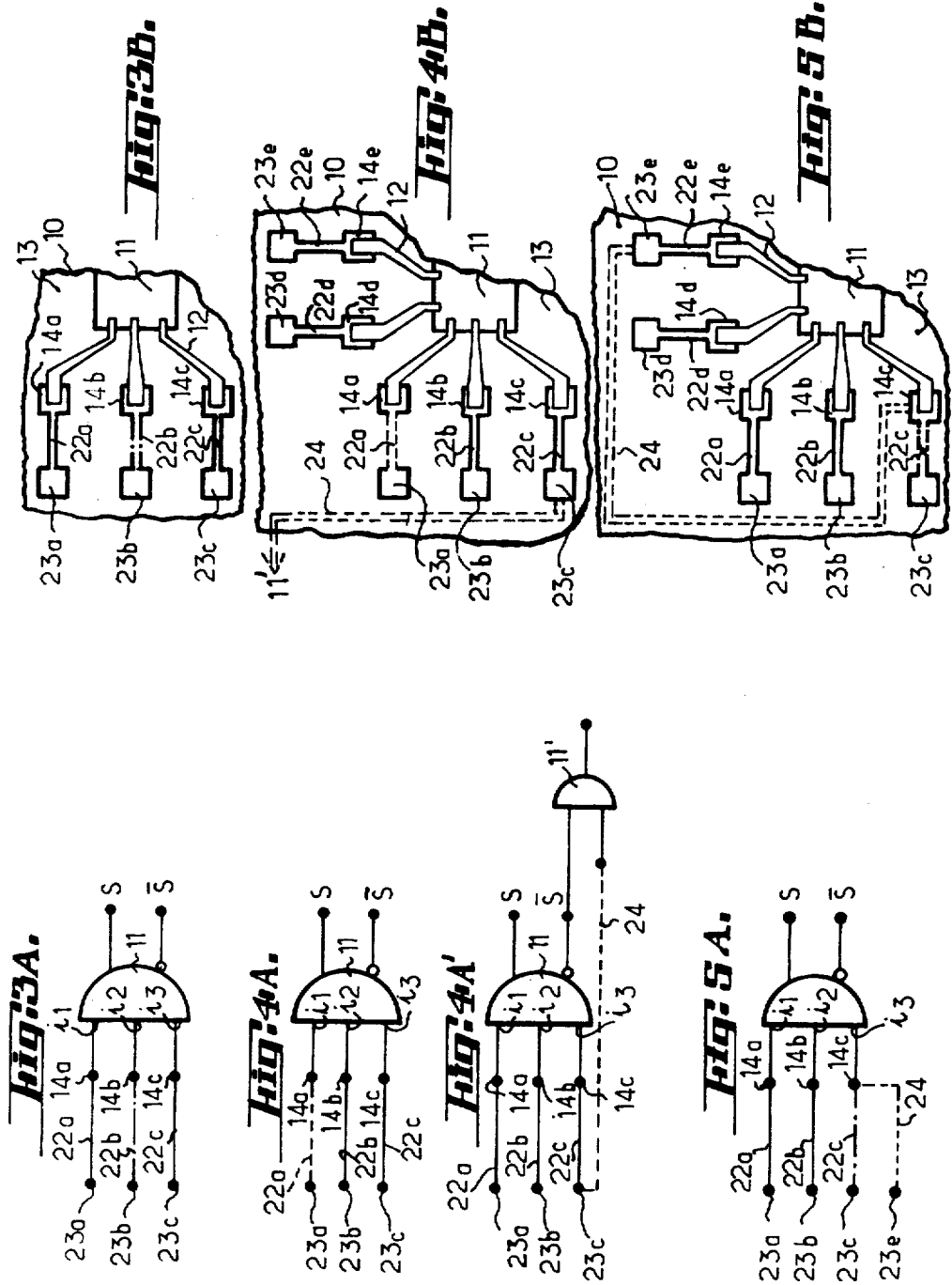

SUBSTRATE FOR INTERCONNECTING ELECTRONIC INTEGRATED CIRCUIT COMPONENTS HAVING A REPAIR ARRANGEMENT ENABLING MODIFICATION OF CONNECTIONS TO A MOUNTED CHIP DEVICE

This application is a continuation, of application Ser. No. 948,110, filed Oct. 3, 1978 now abandoned.

BACKGROUND OF THE INVENTION

1. Field of the Invention

This invention relates to substrates for interconnecting electronic integrated-circuit components, and more particularly to an arrangement for repairing the electrical circuits which are carried by such substrates.

2. Description of the Prior Art

Modern techniques currently employed to produce electronic equipment, and more particularly data-processing assemblies, are making increasing use of integrated circuit semiconductor devices referred to as integrated circuit chips. They are generally rectangular in shape and are provided along at least one side with output conductors.

Such integrated circuit chips may be interconnected by substrates as is well known. These substrates are generally made of an insulating material provided with connecting conductors produced in the form of circuits printed on a plate. The conductors are usually divided into a plurality of layers which are separated by insulating layers and which are connected together by through-connectors, the latter being formed by openings made in the insulating layers and which are filled with a conductive material so as to make connections between conductive layers lying one above the other. The outermost conductive layer of the multi-layer interconnecting substrate is provided with connecting contacts bordering at least one location or site on the substrate, these sites being intended to receive an electronic component such as an integrated circuit chip. For an example of integrated circuit chips being mounted on an interconnecting substrate, reference may be made to the applications of Raymond Delorme et al, Ser. Nos. 801,787 now U.S. Pat. No. 4,116,376 and 874,652 directed to a method and apparatus for mounting chip devices on a substrate, were filed in the United States Patent and Trademark Office on May 31, 1977 and Feb. 2, 1978, respectively, and which are assigned to the assignee of the present invention.

In view of the fact that the through openings formed in the outermost insulating layer (which is the uppermost insulating layer of the substrate), which are intended to allow connections to the contacts around a site to be made, are aligned with conductors in conductive layers internal to the interconnecting substrate, and bearing in mind the high density of conductors required in a substrate for the purposes of miniaturization, it will be readily appreciated that the position of each of these openings is confined to a narrow zone of tolerance. The result is that the through openings can only be situated inside or outside a site, at which the electronic component or chip is situated.

Modification or repair of interconnecting substrates is often done in design laboratories. In such laboratories, technicians work with highly elaborate substrates and frequently find it necessary or advantageous to modify the interconnecting circuits of the substrate. Such modifications are called for in a number of cases, particularly when "breadboarding" or testing new circuit designs. For example, it may be necessary to isolate the connection to at least one contact connected to a component; to connect a contact to part of the substrate; to isolate a connection to a contact so that the isolated connection or the contact can be connected to another part of the substrate; and to insert a new connection to connect two separate parts of the substrate, such as two contacts associated with the same site or two separate sites. To sum up, to make alterations, it is necessary or advantageous to isolate a connection and/or add another connection to the given substrate. The isolating is done with an instrument which severs the connection, while the additional connection requires the introduction of an additional conductor into the substrate and the soldering of its two ends to the parts of the substrate to be connected.

The use of the isolating instrument and of instruments for guiding the additional conductor and for soldering its ends is only feasible if the repair zone is satisfactorily exposed. This is the case when the contact concerned is attached to a through-connection outside the site where the chip is situated. If on the other hand the through-connection is inside the site, it is necessary for the component to be removed and, in the case of making an additional connection, for this connection to be passed under and between the output conductors of the component so that it can be attached outside the site. There are many disadvantages in doing this.

Firstly, removing the component and replacing it after repair are operations calling for great care which are responsible for a considerable increase in the repair time, or indeed in the loss of the component, which makes it a remarkably expensive undertaking. Then, as regards the actual operation itself, it is necessary again to make use of an apparatus for mounting integrated circuit devices on a substrate (such as the apparatus which is described in the aforenoted patent application Ser. No. 801,787) in order to fit the component, while allowing for the additional connection which has to pass under and between the output conductors of the component. Finally, and particularly from the point of view of the use, the reliability of such repairs are always in question because of all the risks of short-circuits between, on the one hand, the soldered joint of the inner end of the additional connection and the output conductors of the component, and on the other hand, the additional connection itself and the output conductors of the component.

The subject invention provides a repair arrangement which does not suffer from the above mentioned disadvantages of prior art repair arrangements.

SUMMARY OF THE INVENTION

An interconnecting substrate according to the invention comprises: an insulating carrier on which rests a set of alternating, superimposed conductive and insulating layers, contacts formed on the uppermost insulating layer which border at least one site intended for a component whose output conductors are to be connected to the said contacts; and through-connections which enable the said contacts to be coupled, via the uppermost conductive layer to one of the inner conductive layers, the through-connections including at least one through-connection on the inside of the site relative to at least a given one of the said contacts, and a repair arrangement which comprises a shunt conductor means connected to the said given one of said contacts which has a part outside the site which is connected to an additional contact which replaces the said given one of said contacts for the connection to the said component.

In other words, a repair arrangement according to the invention consists, whatever the original configuration of the interconnecting substrate, on substituting for a connection inside a site over which a chip is situated between a contact and a through-connection, a link which has a part outside the site from which it is possible to make the repair without the need to remove the component. In practice, the repair arrangement is made up of conductive and insulating layers which are deposited at least locally on the substrate.

BRIEF DESCRIPTION OF THE DRAWINGS

The features and advantages of the invention will become clearer from the following description, which is given with reference to the accompanying drawings.

In the drawings,

FIG. 1 is a view from above of part of a conventional interconnecting substrate which includes an integrated circuit chip, but which does not have a repair arrangement according to the invention.

FIG. 2 is a cross-sectional view on line II—II of FIG. 1.

FIGS. 3A and 3B are symbolic and diagrammatic view respectively of an example of a repair involving isolating a connection from a substrate.

FIGS. 4A, 4A' and 4B are illustrations in symbolic and diagrammatic form respectively of an example of a repair involving adding an extra connection to the substrate.

FIGS. 5A and 5B are illustrations in symbolic and diagrammatic form respectively of an example of a repair involving isolating an existing connection and connecting one of the parts of the isolated connection to another part of the substrate using an additional connection.

FIG. 6 is a sectional view of part of an interconnecting substrate provided with a repair arrangement according to the invention.

FIG. 7 is a schematic perspective view of the shunt conductor means which forms part of the repair arrangement shown in FIG. 6.

DESCRIPTION OF THE PREFERRED EMBODIMENTS

Figure 8:
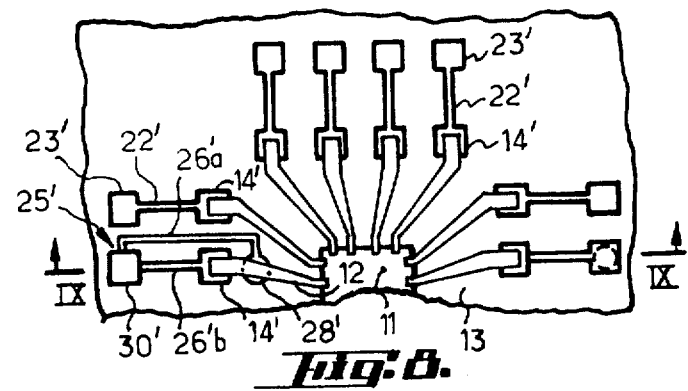
FIG. 8 is a view from above of a modified embodiment of repair arrangement according to the invention formed on part of the interconnecting substrate.

FIG. 1 is a view from above of part of an interconnecting substrate 10 which carries a component 11 such as an integrated circuit chip for example. This chip is provided with a plurality of output conductors 12 and on the substrate 10 it occupies a site 13 which is bounded by contacts 14 which are intended to receive the free ends of respective ones of the output conductors 12 of the chip 11.

Depending on the function of the chip 11, contacts 14 are connected together or to contacts associated with other sites 13, either by connections formed entirely on the exposed surface of the substrate, such as a conductor 15, or by connections 16, 17 which may include conductors belonging to conductive layers on the inside of the substrate, in the manner shown in FIG. 6 for example.

FIG. 2 is a cross-sectional view on line II—II of FIG. 1 from which it can be seen that the substrate 10 has a carrier or base plate 18 of insulating material on which alternating and superimposed conductive layers 19a, 19b and 19c and insulating layers 20a, 20b are formed in succession, each conductive layer being formed by an array of conductors. The conductors in a layer are linked to respective conductors in another conductive layer via through-connections 21 which are formed in the insulating layers 20. Layers 20 in addition to supporting the conductive layers 19 and through-connections 21 also serve to insulate the spaced conductive layers so that electrical connection can only be established through preselected through-connections.

Each connection 16 originating from an exposed contact 14 connected to a chip output conductor 12 as shown in FIGS. 1 and 2 is made up of a conductor belonging to the uppermost conductive layer 19a outside the site 13, at least one through-connection 21 and a conductor from an inner conductive layer 19. Connections which originate from a through-connection 21 inside the site 13, are marked 17.

FIGS. 3, 4 and 5 show various examples of modifications which can be made to a part of an interconnecting substrate 10 similar to that shown in FIGS. 1 and 2. For this reason, similar items are identified by the same reference numerals.

In these examples it is assumed that the modifications affect an integrated circuit chip 11 which performs the functions of a logic gate having three inputs i1–i3 and two complementary outputs s and s, as shown in FIGS. 3A, 4A, 4A' and 5A. To assist comprehension, the terminals 14 are distinguished from each other by respectively designating the terminals of the three inputs i1, i2, i3 of gate 11, as 14a, 14b and 14c, and by designating as 14d and 14e the terminals for two other terminations of the chip 11, such as the terminals supplying operating current or the two output terminals of the gate.

It is also assumed in these examples, that all the connections 22 are to the exposed contacts 14a–14c and are connections outside the site 13 and that they are thus either surface conductors 15, or conductor layers 16 leading to connections outside the site 13. Consequently, the connecting areas or terminals 23a–23c which are connected respectively to contacts 14a–14c are either contacts associated with other sites 13 on the substrate or are the upper faces of through-connections 21.

FIGS. 3A and 3B shows a modification consisting in isolating the connection 22b. The isolated connection is indicated by a chain line in the Figures. The isolation is preformed by severing the connection by any known mechanical or chemical method (by local attack or evaporation). FIGS. 4A and 4B relate to the addition to the substrate of further connection 22A, which must necessarily be a surface connection shown by a dark line. FIGS. 4A' and 4B show the addition of a further connection 24 which may, for example, connect the face of an outside through-connection 23c relating to contact 14c to a contact of a chip which is not shown in FIG. B, but which is associated with another site for a chip 11', as shown in FIG. 4A'.

Finally, FIGS. 5A and 5B relate to a combination of the isolation of connection 22c and the addition to contact 14c of an additional connection 24 which is to link contact 14c to another part of the substrate, the connecting face 23c in the example shown.

FIGS. 3, 4 and 5 clearly illustrate how easy it is to repair or modify an interconnecting substrate when the repair involves a connection outside of a site 13. However, the figures also illustrate how difficult it would be to make a repair inside of the site. For clarity in the drawings the contacts 14 and the connections 22 are shown well spaced out. However, in reality, they are very close together and the number of external conductors 12 for the chips 11 may be large. This being the case, it will be appreciated that to make a repair on the inside of a site it is necessary to remove the chip and then replace it.

FIGS. 6 and 7 show a repair arrangement 25 according to the invention for an interconnecting substrate 10 as illustrated in FIGS. 1 and 2. In FIG. 6, it will again be seen that the substrate includes the carrier 18, the three conductive layers 19a, 19b and 19c, and the two insulating layers 20a and 20b. The chip 11 rests on the uppermost insulating layer 20a. The repair arrangement 25 according to the invention comprises a shunt conductor means 26 which is connected to at least each internal contact 14 which is connected to an inside or internal connection 17, and which is shaped to have a part outside the site 13 which can then be operated on to allow the repair to be made outside the site. FIG. 7 is a perspective view of the shunt conductor means 26, while FIG. 6 is a cross-sectional view of the repair arrangement 25.

The arrangement comprises a first insulating repair layer 27a which covers at least a zone of the upper most conductive layer 19a of the substrate which overlaps a contact 14 provided with an internal connection 17. In the embodiment illustrated, a repair through-connection 28a is formed in the insulating repair layer 27a at the point where the external contact 14 would be situated. By depositing a conductive layer 29a, a conductor 26a which is connected to the contact 14 is formed outside of the site 13. A second insulating layer 27b is then deposited on top of the conductive layer 29a and in it is formed a through-connection 28b at the point where the end of the conductor 26a which lies outside of the site 13 is situated. Contact 14 now is no longer external of the substate because of its being covered by the first and second insulating layers. On top of this conductive layer 27b is deposited a second conductive repair layer 29b to form conductor 26b of the repair arrangement. Conductor 26b lies parallel to conductor 26a and has two connecting regions, namely an auxiliary connecting region 30 which covers through-connection 28b and an additional external contact area 14'. Contact area 14' serves as a substitute for contact 14 of the original substrate interconnector to allow the conductor 12 of chip 21 to be soldered to the substrate. In this way it is possible solder an additional connection to the region 30 or to isolate regions 30 from contact 14', by interrupting conductor 26b without having to remove chip 21.

This embodiment of the repair arrangement 25 may be modified in a number of ways. As an example, the through-connection 28a may be formed at contact 14 or anywhere along connection 17. Also, the conductor 26b may have a plurality of auxiliary connecting regions 30 to avoid having to solder a plurality of additional connections to the same region. In addition, as is shown in FIG. 6, the insulating repair layers 27a and 27b may be extended across the substrate beyond the zone covering contact 14, for example to form at least one connecting region from a conductor which is initially situated on the uppermost conductive layer 19a of the substrate.

Figure 9:
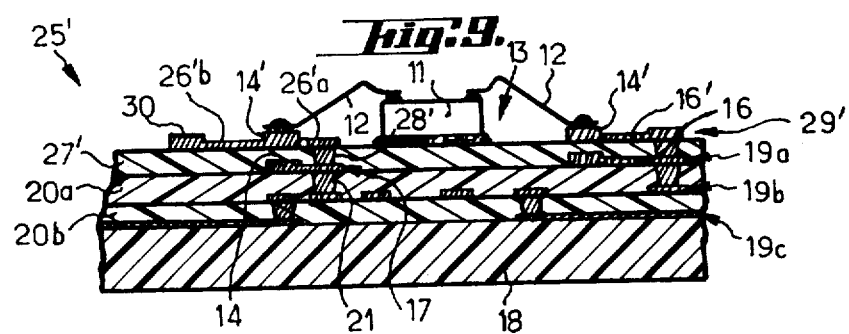
FIG. 9 is a sectional view on line IX—IX of FIG. 8.
Figure 10:
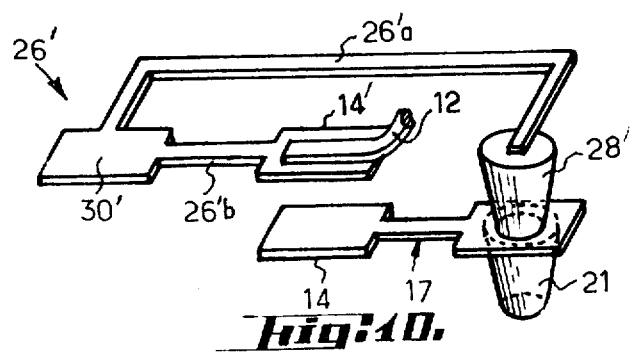
FIG. 10 is a diagrammatic perspective view illustrating the shunt conductor means of the repair arrangement shown in FIGS. 8 and 9.

FIGS. 8, 9 and 10 illustrate a second embodiment of repair arrangement 25 according to the invention. The same reference numerals refer to the same items as were shown in the previous Figures, those of arrangement 25 being given a prime.

In this embodiment it is assumed that the contacts 14 and their conductors 12 are sufficiently well spaced to allow a conductor of the shunt means 26' to be passed between them. A repair of this nature only requires a single insulating repair layer 27' to be deposited. This single layer has formed therein a through-connection 28; on the inside of the site zone 13 which is in contact with connection 17, for example at the region formed by the uppermost part of the through-connection 21 inside the site 13. It is therefore sufficient to deposit a conductive repair layer 29' and to treat or etch it in a known manner to be able to form in particular the shunt conductor means 26'. Shunt conductor means 26' comprises, as shown in FIG. 10, a conductive connection including conductor 26'a passing between two adjoining contacts and being connected at one end to through-connection 28' and at its other end to at least one auxiliary connecting region 30'. Region 30' is connected to the end of conductor 26'a on the outside of site 13 and to an additional external contact 14' which is substituted for contact 14 to allow the output conductor 12 from the chip 11 to be connected to the substrate 10. Connection to contact 14' is established through a conductor 26'b which connects the connecting region 30' to the additional contact 14'.

It should be apparent that the repair insulating layer 27' may only occupy the area or zone covered by a single contact 14 provided with an outside connection 17. However, as shown in FIGS. 8 and 9, this layer is shown extended to the whole of the site 13 and the contacts 14, so that the chip 11 then rests on the insulating repair layer 27'.

It can be seen from the foregoing description that the repair arrangement 25, 25' according to the invention may be produced either in a systematic fashion so as to allow any subsequent repairs over all the substrate, by substituting for each inside connection 17 a shunt conductor member according to the invention, or in a particular operation affecting certain given contacts on a given substrate.

In broad terms, the invention is in no way restricted to the examples which have been given, but in fact covers all means which form technical equivalents of the means described, as well as combinations thereof if these are made within the full scope and true spirit of the invention as defined in the following claims.

We claim:

1. A substrate for interconnecting electronic integrated circuit components including a repair arrangement enabling modification of a connection to a mounted circuit component without removal thereof comprises:
   an insulating layer (18),
   a first set of alternating, superimposed conductive and insulating layers (19a, 20a, 19b, 20b, 19c) overlying said base, said first set of layers including an uppermost first insulating layer (20a) adapted to have mounted thereon an integrated circuit component (11) having a plurality of finger-like conductors (12) and an uppermost first conductive layer (19) having a plurality of contacts (14) thereon defining a site location within which the circuit component is mounted, at least one first interval through connection (17) within said site location and associated with at least a predetermined one of said contacts and being interconnected to said predetermined contact via said first conductive layer, a second set of alternating superimposed conductive and insulating layers (29a, 27a, 29b, 27b) overlying said first set, said second set including an uppermost second insulating layer (27b) and an uppermost second conductive layer (29b), a plurality of contacts (14') on said second conductive layer each adapted to be connected to an associated finger-like conductor (12), conductor means for connecting one of said last named contacts (14') to said predetermined contact, said means including at least one second through connection (28a, 28b) in each insulating layer of the second set connected between the uppermost second conductive layer (29b) and an internal conductive layer (29a) of the second set, said second through connection having a part external of the site and accessible from the exterior of the substrate whereby the connection between the predetermined contact and the associated finger-like conductor may be modified without removing the mounted circuit component.

2. A substrate as set forth in claim 1 wherein said part on the outside of the site includes at least one auxiliary connector region.

3. A substrate as set forth in claim 13, wherein said conductor means comprises an insulating repair zone (26) on the said first uppermost conductive layer (19a) of the said first set of layers, a first conductor (26a) connected to the said second through-connection (28a) and having a part on the outside of the site, at least one auxiliary through connecting region (28b) connected at one end to the part of the said first conductor (26a), outside of the site, a second conductor (26b) connected at one end to the other end of said auxiliary connecting region (28b) and at its other end to the said one of said named contacts.

4. A substrate as set forth in claim 3 wherein the insulating and conductive layers of the second set of layers extend over an area covering the said first internal through-connection and surrounding the circuit component.

5. A substrate as set forth in claim 3 wherein the conductive and insulating layers of the second set of layers extend over at least part of the said substrate.

* * * * *